US010492350B2

(12) United States Patent
Yokoyama et al.

(10) Patent No.: US 10,492,350 B2
(45) Date of Patent: Nov. 26, 2019

(54) ELECTRONIC COMPONENT MOUNTING METHOD AND ELECTRONIC COMPONENT MOUNTING APPARATUS

(71) Applicant: Panasonic Intellectual Property Management Co., Ltd., Osaka (JP)

(72) Inventors: Dai Yokoyama, Yamanashi (JP);
Hideaki Watanabe, Yamanashi (JP);
Yosuke Nagasawa, Yamanashi (JP);
Shigeki Imafuku, Yamanashi (JP);
Kian Hong Lam, Singapore (SG)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 616 days.

(21) Appl. No.: 15/206,272

(22) Filed: Jul. 10, 2016

(65) Prior Publication Data
US 2017/0034968 A1    Feb. 2, 2017

(30) Foreign Application Priority Data
Jul. 31, 2015   (JP) ................................. 2015-151432

(51) Int. Cl.
*H05K 13/04* (2006.01)
*H05K 3/30* (2006.01)

(52) U.S. Cl.
CPC ......... *H05K 13/0413* (2013.01); *H05K 3/306* (2013.01); *Y10T 29/49133* (2015.01); *Y10T 29/49139* (2015.01); *Y10T 29/53183* (2015.01)

(58) Field of Classification Search
CPC ................ H05K 13/0413; H05K 3/306; Y10T 29/49133; Y10T 29/49139; Y10T 29/53183
See application file for complete search history.

(56) References Cited

U.S. PATENT DOCUMENTS

| 4,964,211 | A | * | 10/1990 | Arao | ...................... | B23P 19/00 |
| | | | | | | 29/705 |
| 5,687,831 | A | * | 11/1997 | Carlisle | ................... | A61F 11/12 |
| | | | | | | 198/395 |
| 10,051,744 | B2 | * | 8/2018 | Watanabe | .............. | H05K 3/306 |

FOREIGN PATENT DOCUMENTS

JP       2008-023641       2/2008

* cited by examiner

*Primary Examiner* — Livius R. Cazan
(74) *Attorney, Agent, or Firm* — Pearne & Gordon LLP

(57) ABSTRACT

A position and orientation of an electronic component attitude are recognized, a mounting head is moved above the electronic component, a rotator is horizontally rotated so that a lower surface of the electronic component is oriented in a direction opposite to a pusher, the electronic component of the fallen-down attitude is sucked and held by the nozzle by lowering a component holder, a attitude of the electronic component that is held is changed to a stand-up attitude by vertically rotating the component holder, leads of the electronic component of which the attitude is changed to the stand-up attitude and insertion holes of the substrate into which the leads are inserted are positioned, and the leads are inserted into the insertion holes of the substrate by pushing the electronic component toward the substrate by causing the pusher to abut against an upper surface of the electronic component of the stand-up attitude.

13 Claims, 14 Drawing Sheets

ELECTRONIC COMPONENT MOUNTING METHOD AND ELECTRONIC COMPONENT MOUNTING APPARATUS

BACKGROUND

1. Technical Field

The present disclosure relates to an electronic component mounting method for mounting an electronic component having protruded leads on a substrate by a mounting head and an electronic component mounting apparatus.

2. Description of the Related Art

In a component mounting line for producing an electronic substrate by mounting an electronic component on a substrate, various kinds of components are mounted on the substrate by an electronic component mounting apparatus. For these components, there is a surface mounting component such as a small chip-type component and a QFP which is to be soldered to an electrode surface of a circuit substrate. Otherwise, there is an insertion component such as a power transistor and a connector component which has leads protruded for connection and is mounted by inserting a lead into a mounting hole formed in the circuit substrate. A supply form of the insertion component in the electronic component mounting apparatus varies depending on component types. In a case where the component is supplied in a fallen-down attitude by being stored in a tray and the like, in a case where the component is supplied in a vertical attitude in a manner in which a plurality of the electronic components are connected by taping, and the like, the supply attitudes of the component are different by the component type.

In a case where the insertion component is supplied in the fallen-down attitude, since the insertion component is required to change the attitude to a stand-up attitude prior to mounting of the insertion component on the substrate, a component inserter including a function of changing the attitude of the insertion component from the fallen-down attitude to the stand-up attitude has been proposed (for example, see Japanese Patent Unexamined Publication No. 2008-23641). In a prior art example indicated in Patent Literature, a component holding hand for holding the component is configured as a link mechanism having two arms for pinching and gripping the component, and an suction device for sucking the component. The component holding hand handles the component and then the attitude of the component taken out from a component supply device is changed from the fallen-down attitude to the stand-up attitude.

SUMMARY

One exemplary embodiment of the disclosure is made for an electronic component which has protruded leads and is supplied in a fallen-down attitude, and an object thereof is to provide an electronic component mounting method and an electronic component mounting apparatus.

In the electronic component mounting method and the electronic component mounting apparatus, it is possible to efficiently mount the electronic component on a substrate by changing a attitude of the electronic component by a mounting head having a compact configuration.

An electronic component mounting method of an exemplary embodiment of the disclosure is an electronic component mounting method for mounting an electronic component on a substrate by inserting at least one lead protruding from a lower surface thereof into an insertion hole of the substrate. The electronic component mounting method includes a mounting head preparation step, an electronic component supply step, an electronic component recognition step, an electronic component suction preparation step, an electronic component pick-up step, a attitude change step, a positioning step, and an insertion step. In the mounting head preparation step, the mounting head is prepared. The mounting head has a component holder, a pusher, and a rotator. The component holder is configured such that a suction path opened downward is formed and has a nozzle for holding the electronic component at an opening end of the suction path by using negative pressure. The pusher abuts against the electronic component held by the nozzle and pushes the electronic component onto the substrate. The rotator is configured such that the component holder and the pusher are held, and is horizontally rotated therewith. The electronic component supply step supplies the electronic component in a fallen-down attitude. The electronic component recognition step recognizes a position and an orientation of the electronic component supplied in the fallen-down attitude in a horizontal direction. The electronic component suction preparation step horizontally rotates the rotator so that the lower surface of the electronic component is oriented in a direction opposite to the pusher while moving the mounting head so as to position the opening end above the electronic component recognized in the electronic component recognition step. The electronic component pick-up step sucks and holds the electronic component of the fallen-down attitude at the opening end of the nozzle by lowering the component holder. The attitude change step changes the electronic component held at the opening end to a stand-up attitude by vertically rotating the component holder. The positioning step positions leads of the electronic component of which the attitude is changed to the stand-up attitude and the insertion holes of the substrate into which the leads are inserted by moving the mounting head. The insertion step inserts the leads into the insertion holes of the substrate by causing the pusher to abut against an upper surface of the electronic component of the stand-up attitude and pushing the pusher toward the substrate.

An electronic component mounting apparatus of an exemplary embodiment of the disclosure having a mounting head for mounting an electronic component on a substrate, includes: an elevator, a rotator, a rotation device, a component holder, a attitude changing device, a pusher, and a pusher driving device. The elevator is configured such that the mounting head is lifted and lowered by the elevation device together with the elevation device. The rotation device causes the rotator that is held to be horizontally rotatable with respect to the elevator to horizontally rotate with respect to the elevator. The component holder has a suction path connected to a negative pressure generating source and a nozzle for holding the electronic component at an opening end of the suction path by using a negative pressure generated by the negative pressure generating source. The attitude changing device is mounted on the rotator and changes the attitude of the component holder so that the opening end of the nozzle is oriented downward or sideways. The pusher is able to abut against the electronic component held in the nozzle that is oriented sideways. The pusher driving device pushes the electronic component held in the nozzle toward the substrate by driving the pusher.

According to the electronic component mounting method of one exemplary embodiment of the disclosure, it is possible to efficiently mount the electronic component on the substrate by changing the attitude of the electronic component by the mounting head having a compact configuration for the electronic component having the protruded leads and supplied in the fallen-down attitude.

According to the electronic component mounting apparatus of one exemplary embodiment of the disclosure, it is possible to efficiently mount the electronic component on the substrate by changing the attitude of the electronic component by the mounting head having a compact configuration.

DETAILED DESCRIPTION

Problems in an apparatus of the related art are briefly described prior to the description of an exemplary embodiment. As a supply form of an insertion component of Japanese Patent Unexamined Publication No. 2008-23641, a system, in which a plurality of components are stacked in an irregular fallen-down attitude in a component container such as a tray to be supplied, has been known. However, if a component holding hand indicated in the prior art example described above is applied to the supply form of such an insertion component, there are the following disadvantages due to a configuration of the component holding hand. That is, in order to impart a handling function such as a attitude change of the component to a link device used in the component holding hand, a complex device such as an articulated driving device is needed. Therefore, it is difficult to make the component holding hand to be a simple and compact configuration and to apply the component holding hand to an electronic component mounting field in which it is an essential requirement to make a mounting head for mounting the component to be compact. A configuration for mounting the component on the substrate, after the component supplied in the irregular fallen-down attitude is taken out and the attitude is changed, is not disclosed. In the related art including the prior art described above, for a plurality of insertion components supplied in the irregular fallen-down attitude, it is difficult to efficiently execute a component mounting operation by changing the attitude.

Figure 1:
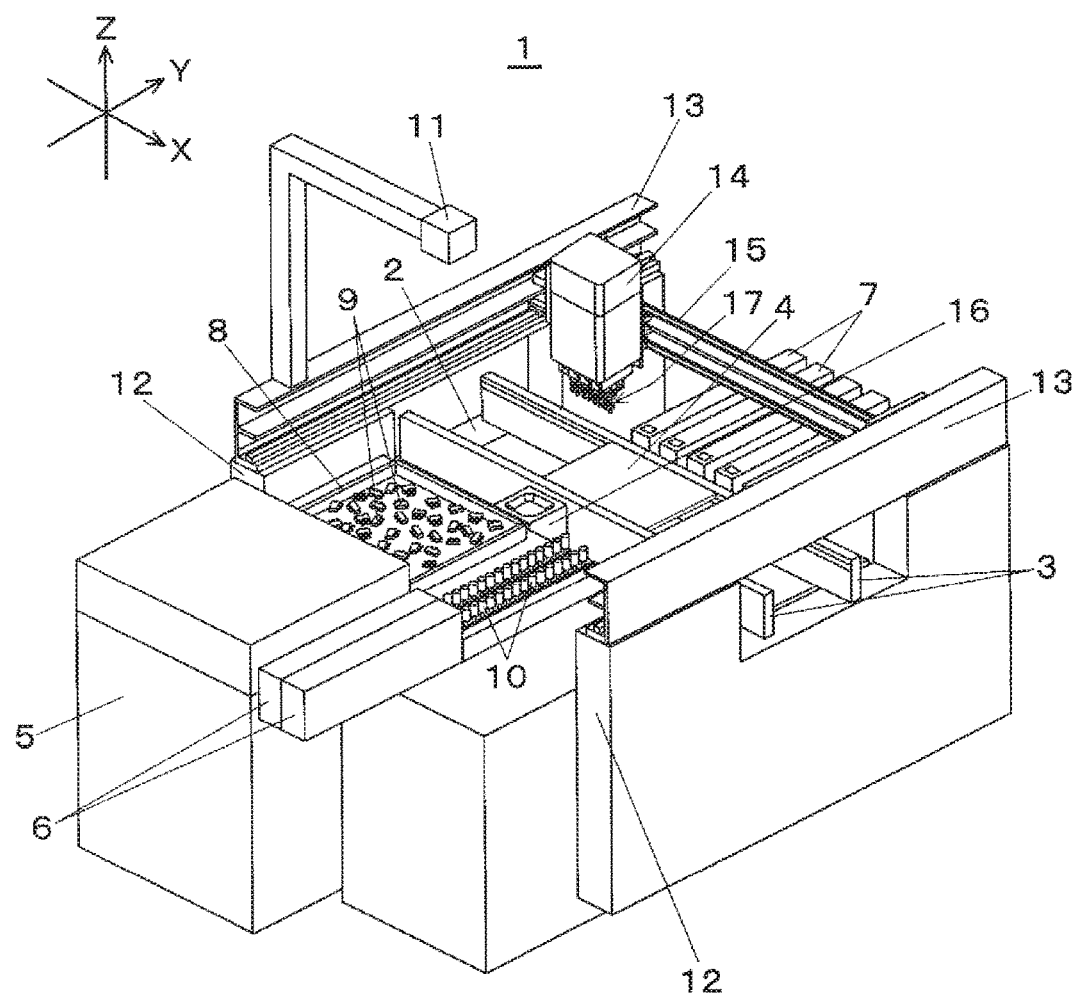
FIG. 1 is a perspective view illustrating a configuration of an electronic component mounting apparatus of an exemplary embodiment of the disclosure.

Next, an exemplary embodiment of the disclosure will be described with reference to the drawings. First, an entire configuration of electronic component mounting apparatus 1 will be described with reference to FIGS. 1 and 2. In FIG. 1, substrate transport device 3 is disposed on an upper surface of base 2 in an X direction (substrate transport direction). Substrate transport device 3 takes out substrate 4 for mounting component from an upstream side device (not illustrated) to transport substrate 4 in the X direction and substrate 4 is positioned in a mounting operation position by a component mounting device described below to be held.

First component supply 5 and second component supply 6 are disposed on one side (front side in FIG. 1) of substrate transport device 3 and third component supply 7 is disposed on the other side. First component supply 5 is a tray feeder for supplying tray 8 that is a plane container in which electronic components 9 of fallen-down attitudes are stored in a random state. The "fallen-down attitude" refers to as a stored attitude in tray 8 in which the electronic component of a shape which cannot be stably self-standing in a mounting attitude mounted on substrate 4 in an individual piece such as the electronic component having leads in such a manner that a side surface capable of being mounted in a stable attitude is a holding bottom surface. In order to mount electronic component 9 of the "fallen-down attitude" on substrate 4, it is necessary to convert the electronic component into the mounting attitude to the substrate by vertically rotating the electronic component by 90 degrees in a vertical plane. In the exemplary embodiment, electronic components 9 are disposed only one layer in tray 8 and electronic components 9 are supplied in a state where a plurality of electronic components 9 or partial electronic components 9 are not overlapped vertically as little as possible.

Second component supply 6 is a radial component feeder for supplying a plurality of radial lead type electronic components 10 connected to each other by being taped in a stand-up attitude. Here, the "stand-up attitude" refers to as the same attitude as the mounting attitude in which the electronic component is mounted on the substrate. That is, the electronic component of the "stand-up attitude" can be mounted on substrate 4 by holding the electronic component without performing attitude conversion.

Figure 2:
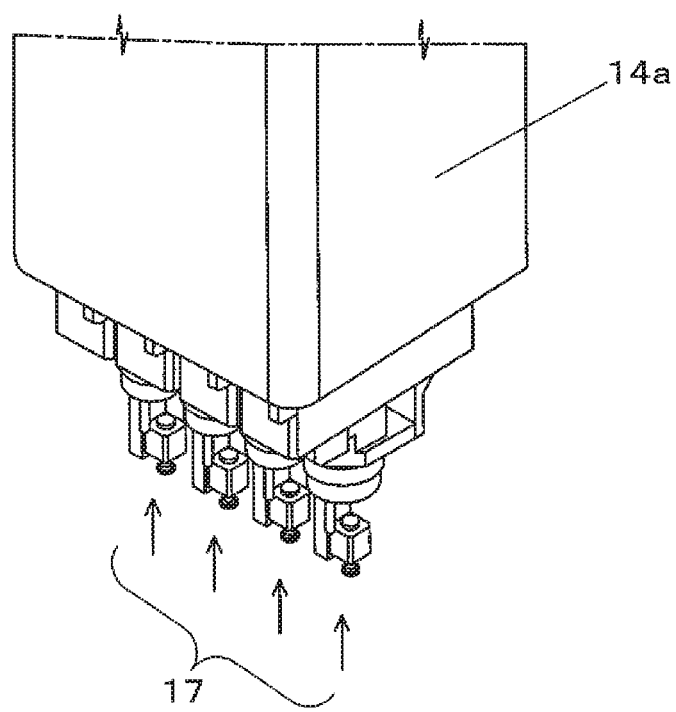
FIG. 2 is a perspective view of a multiple-head in the electronic component mounting apparatus of an exemplary embodiment of the disclosure.

Third component supply 7 is a tape feeder for supplying a surface mounting component such as a chip type component held by a carrier tape. All of first component supply 5, second component supply 6, and third component supply 7 supply the stored electronic components to a position in which the electronic components are taken out by multiple-head 14 of a component mounting device described below. As illustrated in FIG. 2, multiple-head 14 is a multiple type head in which a plurality of mounting heads 17 are configured in parallel. The plurality of mounting heads 17 are enclosed by head cover 14a.

Supply recognition camera 11 of which an imaging direction faces downward is disposed above tray 8. First component supply 5 used in the exemplary embodiment does not supply the component of a take-out target in a lattice-like regular array as a tray feeder that is generally used. First component supply 5 has a form having tray 8 storing electronic components 9 of the fallen-down attitude having leads 9a protruding from a lower surface in a random state. When taking out electronic component 9 from tray 8 by multiple-head 14, mounting heads 17 having multiple-head 14 are individually positioned to electronic components 9 based on a position recognition result recognizing by imaging electronic component 9 by supply recognition camera 11.

Y-axis tables 13 are disposed in a Y direction on upper surfaces of a pair of frames 12 disposed in both ends of base 2 in the Y direction. Multiple-head 14 is movably mounted on X-axis table 15 which is laid in Y-axis tables 13 in the X direction. All of Y-axis tables 13 and X-axis table 15 have direct-acting devices driven by linear motors. Multiple-head 14 is moved in the X direction and the Y direction by driving Y-axis tables 13 and X-axis table 15.

Therefore, mounting heads 17 having multiple-head 14 hold the electronic components supplied from any of first component supply 5, second component supply 6, and third component supply 7. The electronic components are mounted on substrate 4 which is positioned and held on substrate transport device 3 in the stand-up attitude. That is, electronic component mounting apparatus 1 has a function of mounting the electronic components supplied in different attitudes such as the fallen-down attitude and the stand-up attitude on substrate 4 in the stand-up attitude. In the configuration described above, Y-axis tables 13, X-axis table 15, and multiple-head 14 configure the component mounting device for mounting the electronic components on substrate 4.

Component recognition camera 16 of which an imaging direction is upward is disposed between first component supply 5, second component supply 6, and substrate transport device 3. Multiple-head 14 takes out the electronic components from first component supply 5, second component supply 6, and third component supply 7. Thereafter, component recognition camera 16 images the electronic component in a state of being held in each mounting head 17 of multiple-head 14 by positioning multiple-head 14 above component recognition camera 16. Position recognition of the electronic component is executed by recognizing an imaging result. When mounting the electronic components taken out from the component supplies by multiple-head 14 on substrate 4, a mounting position correction is performed based on the position recognition result.

Figure 3:
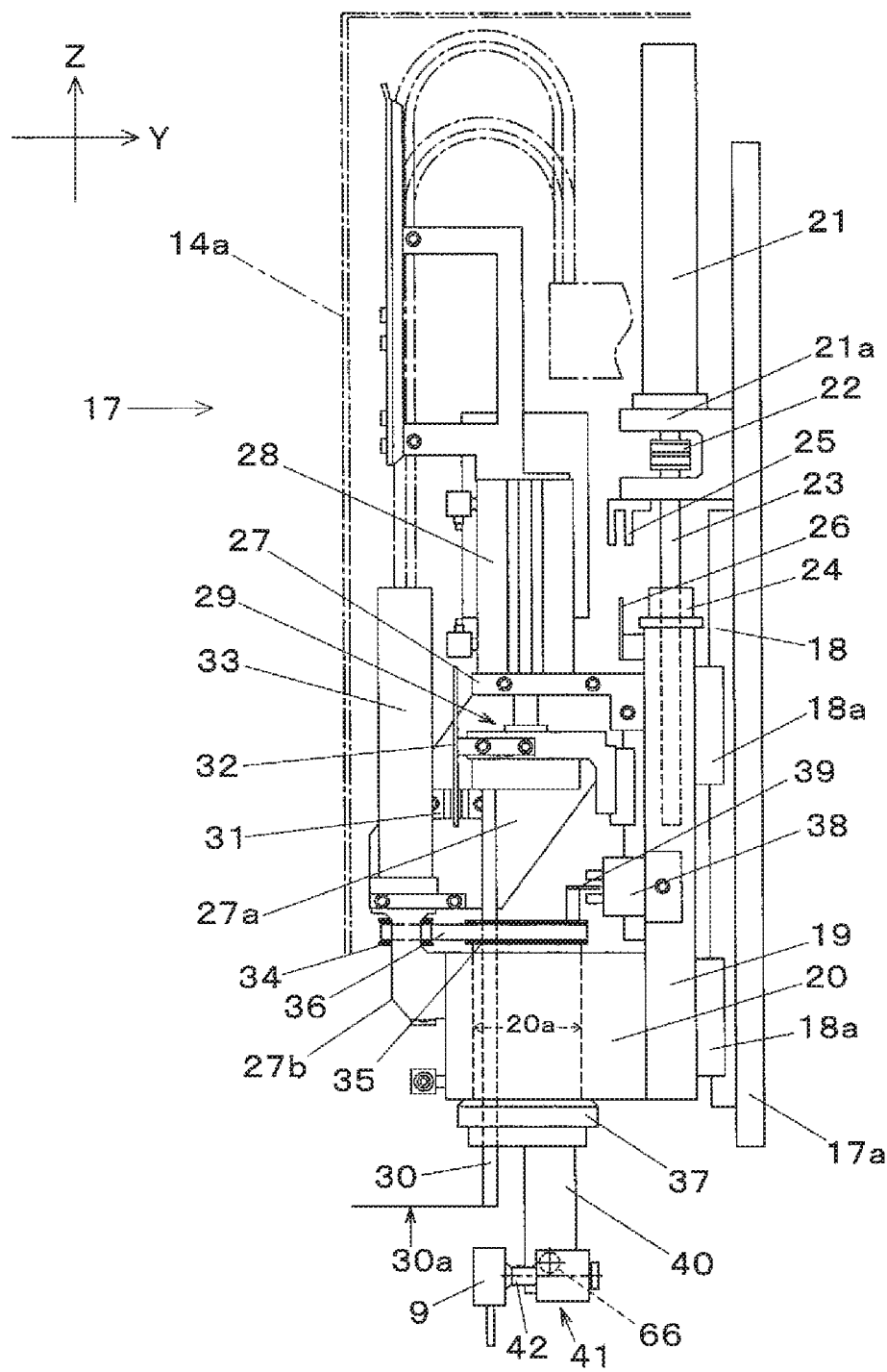
FIG. 3 is a side view of a mounting head in the electronic component mounting apparatus of an exemplary embodiment of the disclosure.

Next, a structure of mounting head 17 will be described with reference to FIGS. 3, 4 and 5. First, an entire configuration of mounting head 17 will be described with reference to FIG. 3 illustrating a side surface of mounting head 17. FIG. 3 illustrates one side surface among those of the plurality of mounting heads 17 covered by head cover 14a in multiple-head 14. Mounting head 17 has vertical mounting base 17a in which each element described below is disposed. Mounting head 17 is incorporated as a unit mounting head configuring multiple-head 14 by coupling mounting base 17a to a base plate (not illustrated) configuring multiple-head 14.

Slider 18a slidably mounted on guide rail 18 vertically disposed in mounting base 17a is fixed to vertical elevation base 19. Z-axis motor 21 fixed to mounting base 17a via bracket 21a is disposed above elevation base 19 in a attitude in which an output shaft faces downward. Feed screw 23 is coupled to the output shaft of Z-axis motor 21 via coupling 22. Feed screw 23 is screwed to nut member 24 coupled to an upper end of elevation base 19 and elevation base 19 is lifted and lowered by driving Z-axis motor 21. Z-axis original-point sensor 25 is disposed in bracket 21a. In an elevating operation of elevation base 19, Z-axis original-point sensor 25 detects detection dog 26 provided in an upper portion of elevation base 19 and thereby a Z-axis original-point in the elevating operation of elevation base 19 is detected. Z-axis motor 21 has built-in encoder and a Z-axis position in the elevating operation of elevation base 19 is obtained by an output pulse signal of the encoder and a Z-axis original-point detection signal by Z-axis original-point sensor 25.

Rotator holder 20 in which fitting hole 20a is provided by vertically passing through rotator holder 20 is coupled to a lower end of elevation base 19. Rotator 37 to which component holder 41 for holding electronic component 9 of mounting target is coupled is mounted on fitting hole 20a via bearing 20b (FIG. 4). Rotator 37 is horizontally rotatably held in rotator holder 20. Component holder 41 has nozzle 42 for holding electronic component 9. Component holder 41 can change the attitude of nozzle 42 downward or sideways by attitude changing device 40.

Upper bracket 27 is mounted on a front surface (left side toward paper surface of FIG. 3) of the upper portion of elevation base 19. Upper bracket 27 protrudes forward to a position in which an upper portion of rotator holder 20 is covered. Lower bracket 27b is mounted on a front surface of rotator holder 20. A side surface of upper bracket 27 and a side surface of lower bracket 27b are connected by connection plate 27a.

Pusher driving cylinder 28 of which rod 28a (FIG. 4) faces downward is disposed in an upper surface of upper bracket 27. Elevation connector 29 is coupled to rod 28a and an upper end of pusher 30 vertically passing through rotator 37 is engaged with elevation connector 29. Elevation connector 29 is lifted and lowered together with pusher 30 by driving pusher driving cylinder 28. Pusher 30 is disposed in a position which is able to abut against electronic component 9 held by suction pad 42a of nozzle 42 of which the attitude is laterally positioned. Pusher 30 is lowered together with elevation connector 29 by driving pusher driving cylinder 28. Therefore, contact 30a of pusher 30 is pressed by coming into contact with electronic component 9 held by component holder 41 and can push leads 9a into insertion holes 4a of substrate 4.

That is, in the configuration described above, pusher driving cylinder 28 and elevation connector 29 are the pusher driving device for driving pusher 30 to be lifted and lowered. The pusher driving device has a function of pushing electronic component 9 held by nozzle 42 toward substrate 4 by driving pusher 30. Pusher 30 is disposed so as to vertically pass through rotator 37. Pusher 30 has contact 30a causing electronic component 9 to abut against a lower end of pusher 30 protruding downward rotator 37 and is configured to couple the upper end of pusher 30 to elevation connector 29 of the pusher driving device.

Dog plate 32 for mounting determination of electronic component 9 is disposed in elevation connector 29. In the elevating operation by which dog plate 32 is lifted and lowered together with elevation connector 29, slits 32a and 32b (see FIG. 10) formed in dog plate 32 are detected by mounting determination sensor 31 fixed to connection plate 27a. Therefore, it is possible to determine whether or not electronic component 9 is correctly mounted on the substrate.

θ-axis motor 33, of which rotary shaft 33a (FIG. 4) faces downward, is disposed on an upper surface of lower bracket 27b. Belt 36 is suspended between driving pulley 34 coupled to rotary shaft 33a and driven pulley 35 coupled to the upper end of rotator 37. θ shaft original-point sensor 38 for detecting detection dog 39 fixed to an upper surface of driven pulley 35 is provided in elevation base 19. In a θ rotating operation of rotator 37, θ shaft original-point sensor 38 detects detection dog 39 and thereby an original point in a θ direction is detected. Rotator 37 is rotated around perpendicular rotational axis AX (FIG. 4) by driving θ-axis motor 33. In the rotation of rotator 37, pusher 30 provided by vertically passing through rotator 37 is also horizontally rotated around rotational axis AX. It is possible to constantly keep a relative positional relationship between pusher 30 and nozzle 42 regardless of the orientation of rotator 37 by such a configuration.

Figure 4:
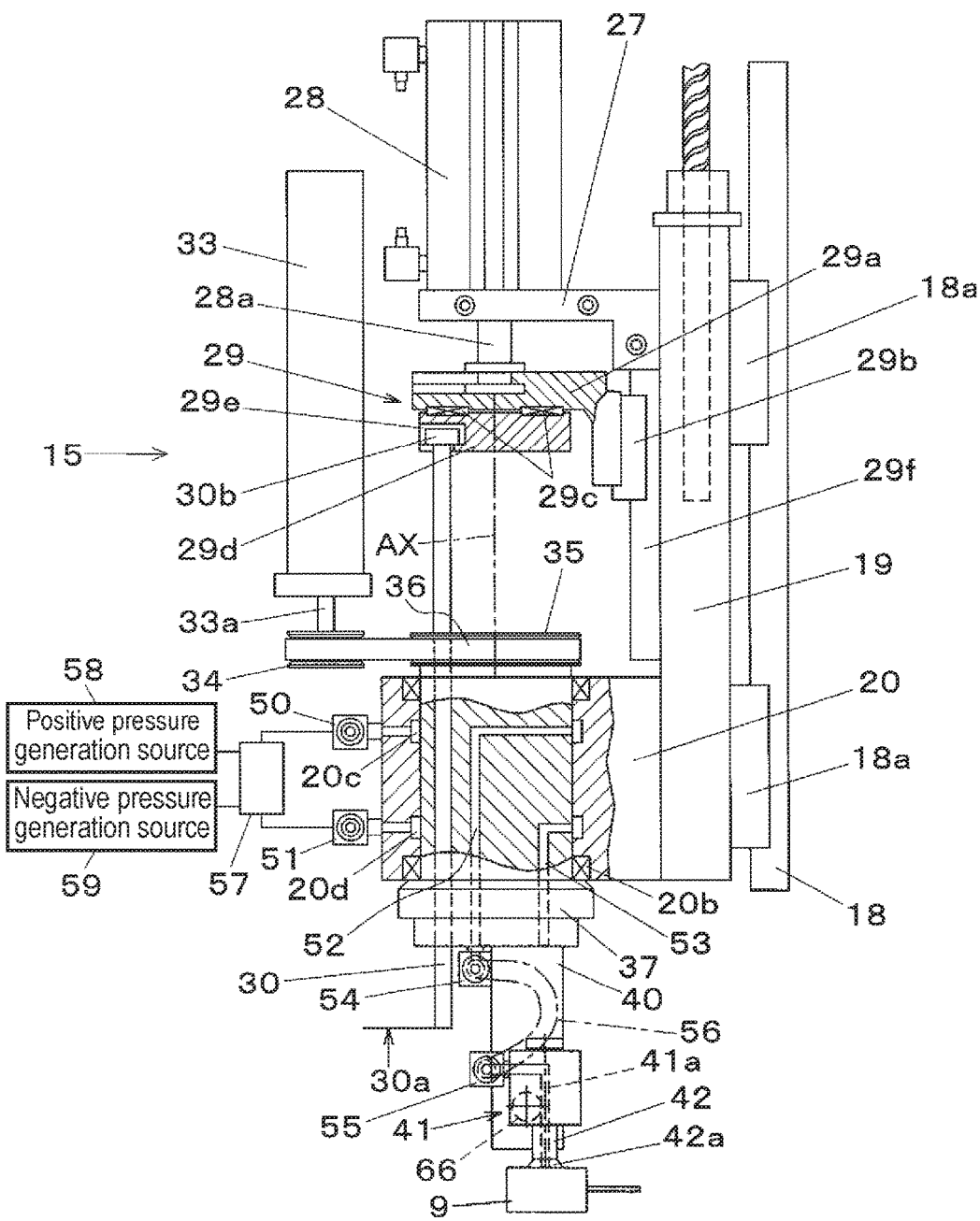
FIG. 4 is a side surface view of a main portion of the mounting head in the electronic component mounting apparatus of an exemplary embodiment of the disclosure.

In FIG. 4 illustrating a main portion of mounting head 17, guide rail 29f is vertically disposed in elevation base 19. Upper member 29a configuring elevation connector 29 is coupled to slider 29b slidably fitted to guide rail 29f in a vertical direction. Rod 28a of pusher driving cylinder 28 is engaged with upper member 29a and lower member 29d is coupled to a lower surface of upper member 29a via needle bearings 29c in a state where relative rotation around rotational axis AX is allowed. Fitting protrusion 30b provided at the upper end of pusher 30 is engaged with engagement recess 29e formed in lower member 29d. Dog plate 32 described above is mounted on upper member 29a.

Elevation connector 29 and pusher 30 are lifted and lowered by driving pusher driving cylinder 28. In this case, since lower member 29d is coupled to upper member 29a via needle bearings 29c, the relative rotation which is horizontally rotated together with rotator 37 with respect to upper member 29a of pusher 30 is not hindered.

In the configuration described above, Z-axis motor 21, feed screw 23, guide rail 18, and slider 18a configure the elevation device. Elevation base 19 and rotator holder 20 configure the elevator which is lifted and lowered by the elevation device. θ-axis motor 33, driving pulley 34, driven pulley 35, and belt 36 configure the rotation device which horizontally rotates rotator 37 with respect to the elevator. Upper member 29a, slider 29b, and guide rail 29f configure a sub-elevator which is relatively vertically moved with respect to the elevator having the configuration described above by pusher driving cylinder 28 that is a driving source. Lower member 29d is horizontally rotatably mounted below the sub-elevator and is a coupler coupled to the upper end of pusher 30. That is, the pusher driving device indicated in the exemplary embodiment is configured to have the sub-elevator having the configuration described above and the coupler horizontally rotatably mounted below the sub-elevator and coupled to the upper end of pusher 30.

Attitude changing device 40 protruding downward from a lower surface of rotator 37 is mounted on a lower portion of rotator 37 which is horizontally rotatably held with respect to the elevator having the configuration described above and is horizontally rotated by the rotation device described above. Component holder 41 having nozzle 42 for sucking and holding electronic component 9 is mounted on output shaft 66 (see FIGS. 5, 6, and 7) provided in a lower portion of attitude changing device 40. Attitude changing device 40 is mounted on rotator 37 and has a function of changing the attitude of component holder 41 so that suction pad 42a, which is at an opening end of nozzle 42, is oriented downward or sideways.

As illustrated in FIG. 4, first annular flow path 20c and second annular flow path 20d are formed on an inner circumferential surface of fitting hole 20a (see FIG. 3) into which rotator 37 is fitted in rotator holder 20. First annular flow path 20c and second annular flow path 20d respectively communicate with first connector 50 and second connector 51. All of first connector 50 and second connector 51 are connected to positive pressure generation source 58 and negative pressure generation source 59 via valve unit 57. First internal flow path 52 and second internal flow path 53, which are opened to a height position communicating with first annular flow path 20c and second annular flow path 20d, are formed on an inside of rotator 37. According to the configuration, first internal flow path 52 and second internal flow path 53 are always in a communication state with first annular flow path 20c and second annular flow path 20d regardless of the position of rotator 37 in the rotating direction.

First internal flow path 52 communicates with third connector 54 provided on the lower surface of rotator 37 and second internal flow path 53 communicates with air introduction hole 61a (see FIG. 6) provided in attitude changing device 40. Third connector 54 is connected to fourth connector 55 provided in component holder 41 via tube piping 56. Here, third connector 54 communicates with suction pad 42a that is at the opening end of nozzle 42 via suction path 41a provided in component holder 41.

Positive pressure air is supplied to attitude changing device 40 via valve unit 57, second annular flow path 20d, and second internal flow path 53 by driving positive pressure generation source 58. Therefore, it is possible to change the attitude of component holder 41 by operating attitude changing device 40. Vacuum suction is performed from suction pad 42a via valve unit 57, first annular flow path 20c, first internal flow path 52, third connector 54, tube piping 56, fourth connector 55, and suction path 41a by driving negative pressure generation source 59. It is possible to hold electronic component 9 by vacuum suction in suction pad 42a.

That is, component holder 41 has a form having suction path 41a connected to negative pressure generation source 59 and nozzle 42 which holds electronic component 9 in suction pad 42a positioned at the opening end of suction path 41a by using the negative pressure generated by negative pressure generation source 59. The positive pressure air is exhausted from suction pad 42a via valve unit 57, first annular flow path 20c, first internal flow path 52, third connector 54, tube piping 56, fourth connector 55, and suction path 41a by driving positive pressure generation source 58. Therefore, it is possible to separate electronic component 9 that is sucked and held by suction pad 42a from nozzle 42.

In vacuum suction or positive pressure exhaustion from suction pad 42a, a vacuum suction flow rate or a positive pressure exhaustion flow rate is detected by flow rate sensor 75 (FIG. 11) and is compared with a threshold set in advance. Therefore, it is possible to detect whether or not nozzle 42 normally holds electronic component 9 using suction pad 42a. In the exemplary embodiment, success or failure of component mounting on substrate 4 is determined by detecting a component holding state by nozzle 42 after a component mounting operation by component holder 41.

Figure 5:
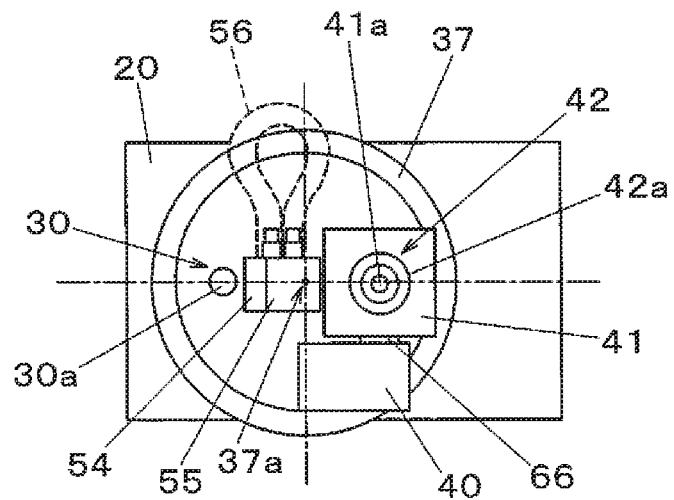
FIG. 5 is a bottom view of the mounting head in the electronic component mounting apparatus of an exemplary embodiment of the disclosure.

Disposition of component holder 41, attitude changing device 40, and pusher 30 on the lower surface of rotator 37 will be described with reference to FIG. 5 illustrating a view of the lower surface of rotator holder 20. In FIG. 5, attitude changing device 40 and pusher 30 further protrude from the lower surface of rotator 37 protruding from the lower surface of rotator holder 20. Component holder 41 having suction pad 42*a* is vertically rotatably provided on an inner side surface of attitude changing device 40 in rotator 37. Here, a state where suction pad 42*a* is oriented downward (surface orientation in the view), that is, a attitude when sucking the electronic component by suction pad 42*a* is illustrated.

Here, a relative positional relationship between contact 30*a* of pusher 30 and suction pad 42*a* is in a disposition in which rotation center 37*a* of rotator 37 is positioned in an intermediate portion on a line connecting contact 30*a* and suction pad 42*a*. That is, the position of contact 30*a* abutting against electronic component 9 in pusher 30 is disposed in a position separated from rotation center 37*a* of rotator 37 in the horizontal direction. The position of contact 30*a* is formed such that a center of suction pad 42*a*, which is in the opening end of nozzle 42 oriented downward, is disposed in a position in which rotation center 37*a* of rotator 37 is interposed between the center of suction pad 42*a* and contact 30*a* of pusher 30 in a plan view.

In the example illustrated in FIG. 5, an example, in which rotation center 37*a* is positioned on the line connecting contact 30*a* and suction pad 42*a*, is illustrated, but rotation center 37*a* is no need to be essentially positioned on the line connecting contact 30*a* and suction pad 42*a*. Rotation center 37*a* may be formed by being interposed between the center of suction pad 42*a* and contact 30*a* in a plan view. In short, the center of suction pad 42*a* and contact 30*a* are respectively disposed in positions separated from rotation center 37*a* on both sides in the horizontal direction in the lower surface of rotator 37. Therefore, it is possible to reduce a radius of rotation of contact 30*a* or nozzle 42 with respect to the rotation center 37*a*. Therefore, component holder 41 and pusher 30 can be disposed within an extremely compact space and thereby it is possible to realize mounting head 17 having a small occupying space in the plane.

Figure 6:
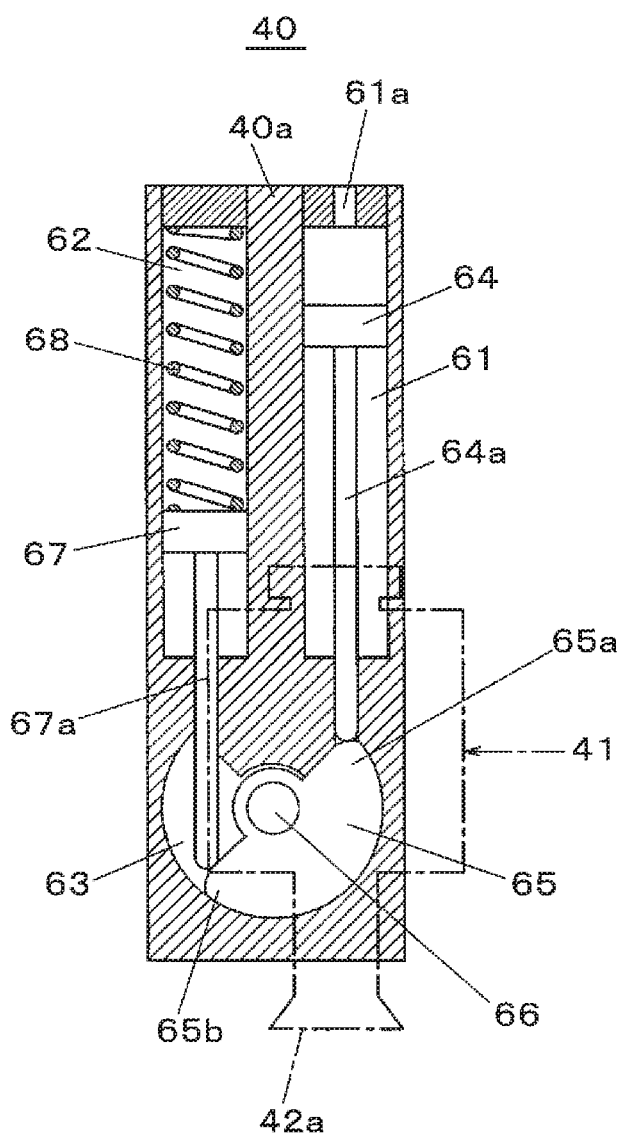
FIG. 6 is a sectional view of a attitude changing device used in the mounting head in the electronic component mounting apparatus of an exemplary embodiment of the disclosure.

Next, an internal structure and a function of attitude changing device 40 will be described with reference to FIGS. 6 and 7. As illustrated in FIG. 6, attitude changing device 40 is mainly configured of rectangular block-shaped main body 40*a* elongated in the vertical direction. Driving cylinder 61 and return cylinder 62 are formed on an inside of main body 40*a* in a longitudinal direction, and fan-shaped housing 63 is formed below driving cylinder 61 and return cylinder 62. Driving piston 64 and return piston 67 respectively having rods 64*a* and 67*a* are fitted into driving cylinder 61 and return cylinder 62. Substantially semi-circular swing member 65 having output shaft 66 that is the horizontal shaft in a center portion is rotatably fitted into housing 63.

Air introduction hole 61*a* through which air pressure for driving is introduced is provided in a top portion of driving cylinder 61 into which driving piston 64 is fitted. Driving piston 64 is lowered, driving end 65*a* is pushed down, and thereby swing member 65 is rotated by introducing air pressure from air introduction hole 61*a* into driving cylinder 61. Component holder 41 is mounted on output shaft 66 coupled to swing member 65. That is, attitude changing device 40 is configured to have swing member 65 that is rotatable around output shaft 66 that is the horizontal shaft and driving piston 64 that rotates swing member 65 by being driven by air pressure in the vertical direction. Component holder 41 is mounted on output shaft 66 (see FIGS. 3 and 4) rotating together with swing member 65.

Spring member 68 that is a compression spring for a returning operation is mounted on an upper portion of return piston 67 in return cylinder 62. In a state where the air pressure for driving is not introduced in driving cylinder 61, return piston 67 is pushed down by a biasing force of spring member 68 and is positioned at a bottom dead center. In this state, a lower end of rod 67*a* pushes down return end 65*b* of swing member 65, swing member 65 is positioned in a rotation limit in the counterclockwise direction, and driving piston 64 is positioned at a top dead center in driving cylinder 61. In this state, component holder 41 coupled to output shaft 66 is held in a attitude in which suction pad 42*a* is oriented downward.

Figure 7:
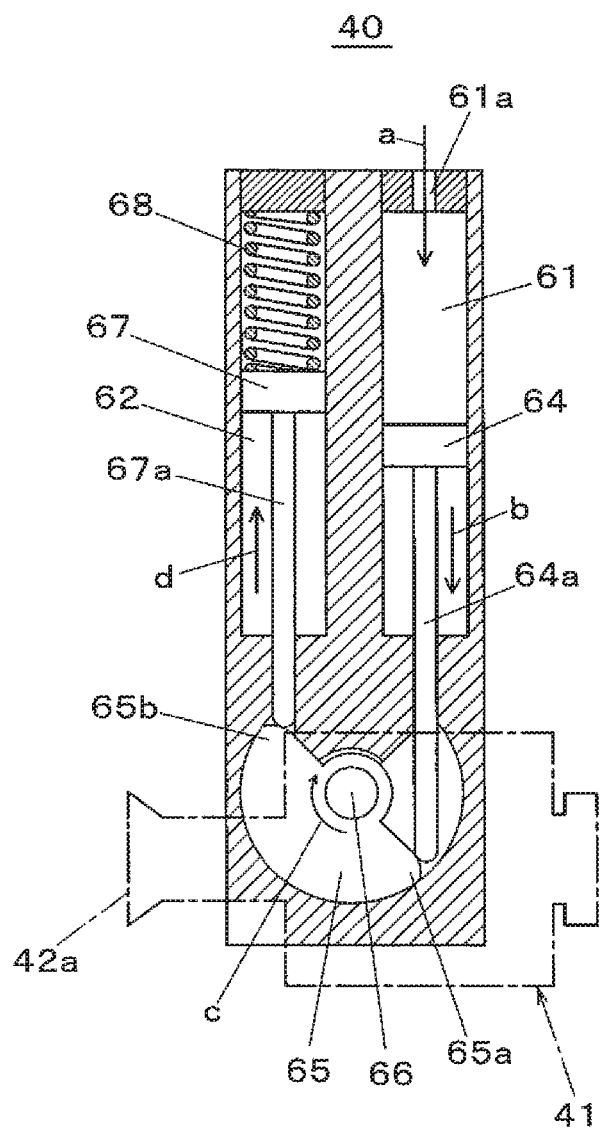
FIG. 7 is a sectional view of the attitude changing device used in the mounting head in the electronic component mounting apparatus of an exemplary embodiment of the disclosure.

FIG. 7 illustrates a state where the air pressure for driving is introduced (arrow a) from air introduction hole 61*a* in attitude changing device 40. That is, driving piston 64 is driven by the air pressure and rod 64*a* is lowered (arrow b) in driving cylinder 61. Therefore, driving end 65*a* of swing member 65 is pushed down, swing member 65 is rotated, and thereby output shaft 66 is rotated (arrow c) in a clockwise direction. Therefore, component holder 41 coupled to output shaft 66 changes the attitude of suction pad 42*a* to the fallen-down attitude. At the same time, rod 67*a* is pushed up (arrow d) by return end 65*b* and spring member 68 is compressed by return piston 67 within return cylinder 62. Introduction of the air pressure from air introduction hole 61*a* is stopped and thereby return piston 67 is pushed down by an elastic force of spring member 68. Therefore, attitude changing device 40 is returned to the state illustrated in FIG. 6 and component holder 41 is in a attitude in which suction pad 42*a* is oriented downward.

Figure 8:
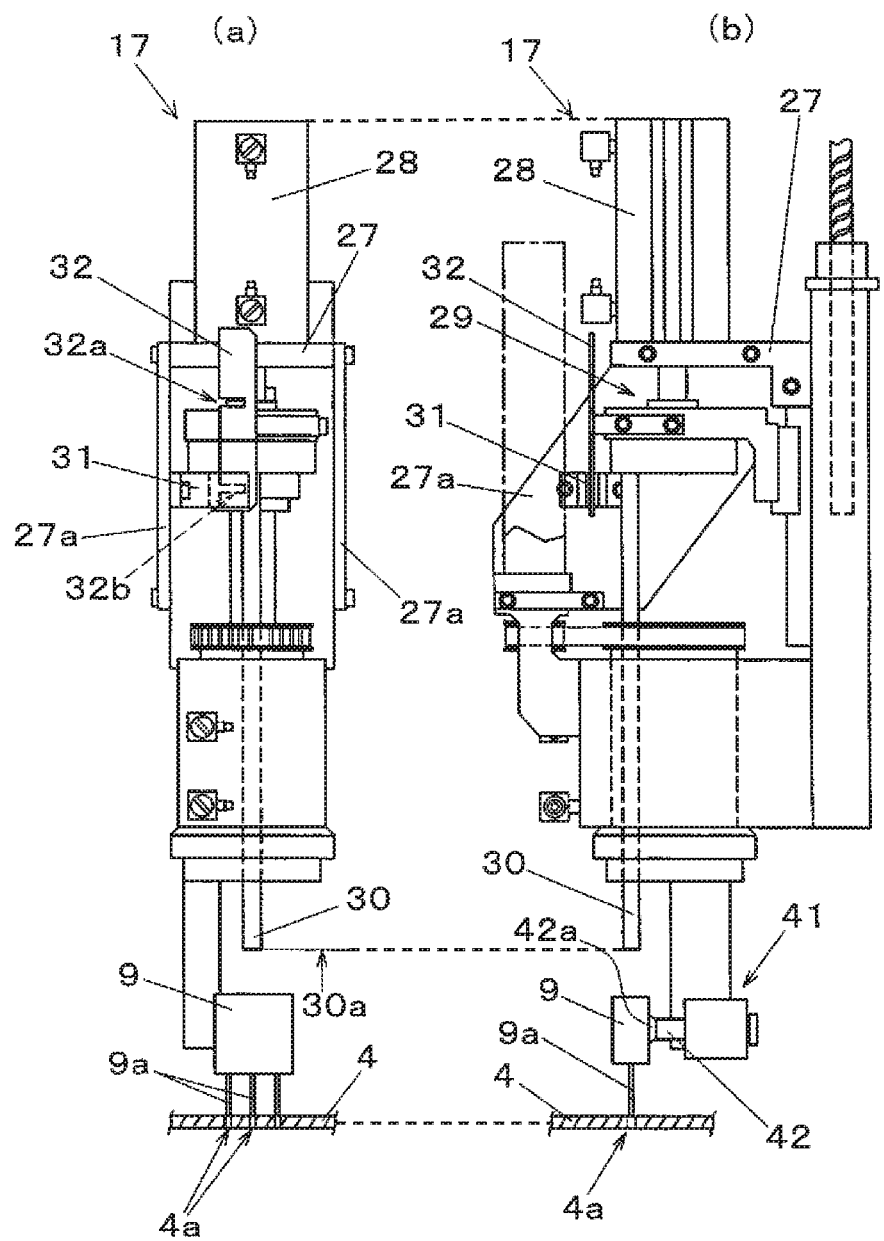
FIG. 8 is a view describing a lead inserting operation in the electronic component mounting apparatus of an exemplary embodiment of the disclosure.

Next, the mounting operation and mis-mounting detection of electronic component 9 by mounting head 17 will be described with reference to FIGS. 8, 9, and 10. First, FIG. 8 illustrate a state where mounting head 17 of a state of sucking and holding electronic component 9 by suction pad 42*a* of component holder 41 is moved with respect to substrate 4 of the mounting target and leads 9*a* of electronic component 9 are positioned in insertion holes 4*a* of substrate 4. In this case, leads 9*a* are not inserted into insertion holes 4*a* and the lower ends of leads 9*a* are in a state of being positioned directly above insertion holes 4*a*. Pusher 30 driven by pusher driving cylinder 28 is in a lifted position and contact 30*a* of the lower end is in a position separated from electronic component 9. This state is confirmed by detecting second slit 32*b* (see FIG. 10) for detecting the lifted position formed in the lower end of dog plate 32 by mounting determination sensor 31.

Figure 9:
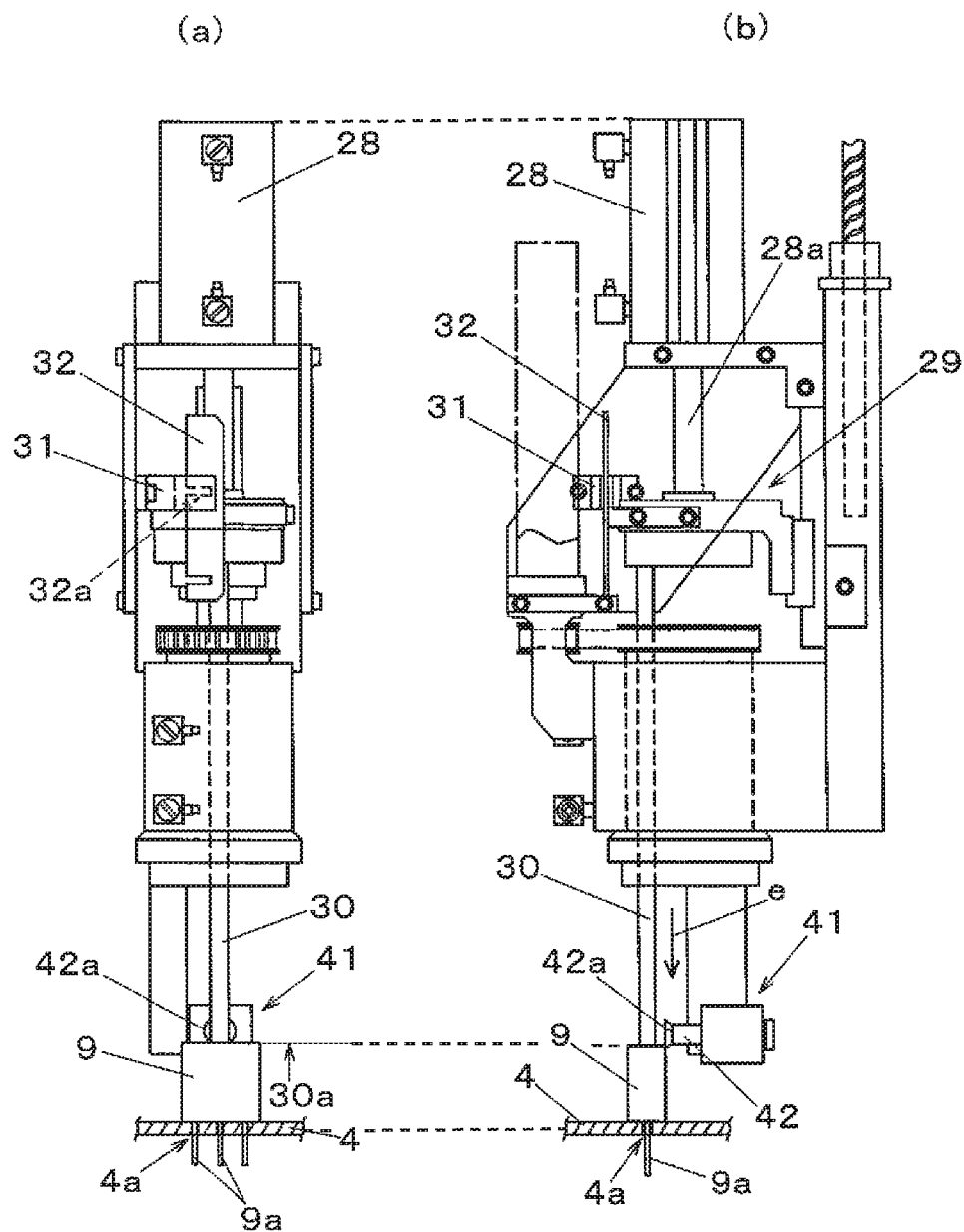
FIG. 9 is a view describing the lead inserting operation in the electronic component mounting apparatus of an exemplary embodiment of the disclosure.
Figure 10:
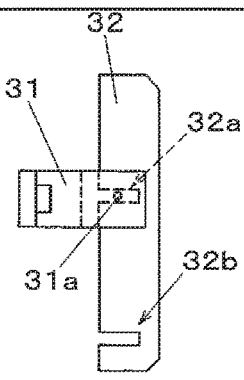
FIG. 10 is a view describing a determining method of the mis-mounting of a component in the electronic component mounting apparatus of an exemplary embodiment of the disclosure.

Next, FIG. 9 illustrate a state where mounting of electronic component 9 is completed by inserting leads 9*a* into insertion holes 4*a* of substrate 4. That is, pusher 30 is lowered (arrow e) by driving pusher driving cylinder 28 and contact 30*a* abuts and presses the upper surface of electronic component 9 in a state of being sucked and held by suction pad 42*a*. Therefore, electronic component 9 in a state of being held by suction pad 42*a* slides downward with the stand-up attitude and leads 9*a* are completely pushed into insertion holes 4*a* of substrate 4. Therefore, mounting of electronic component 9 on substrate 4 is completed. In this case, mounting determination sensor 31 detects first slit 32*a* (see FIG. 10) formed for detecting mounting success in dog plate 32 lowered together with elevation connector 29 and thereby mounting success is detected.

Here, the mounting determination by mounting determination sensor 31 and dog plate 32 will be described. As illustrated in FIGS. 8, 9, dog plate 32 illustrated in FIG. 10 are disposed in elevation connector 29 that is lifted and lowered together with pusher 30 by pusher driving cylinder 28. Two slits of first slit 32a and second slit 32b from the upper side are formed in dog plate 32. Second slit 32b of the lower side is a slit for confirming a state illustrated in FIG. 8(a), that is, pusher 30 is in the lifted position. Mounting determination sensor 31 detects second slit 32b and thereby it is detected that pusher 30 is positioned in the lifted position.

First slit 32a of the upper side is a slit corresponding to a detection position of mounting determination sensor 31 in a state where contact 30a abuts against electronic component 9 that is normally mounted. Mounting determination sensor 31 detects first slit 32a and thereby pusher 30 presses electronic component 9 and it is detected that leads 9a are normally inserted into insertion holes 4a.

A pattern example of mounting success and mounting failure will be described with reference to FIG. 10. FIG. 10(a) illustrates an example in which leads 9a are completely inserted into insertion holes 4a and the mounting is succeeded by pressing electronic component 9 against substrate 4 by contact 30a of pusher 30. In this case, detection optical axis 31a of mounting determination sensor 31 coincides with first slit 32a of dog plate 32, mounting determination sensor 31 detects light transmission, and it is determined that the component mounting is succeeded.

On the other hand, in FIG. 10(b), as a result of misalignment of leads 9a with respect to insertion holes 4a, even if electronic component 9 is pressed against substrate 4 by contact 30a of pusher 30, leads 9a are not inserted into insertion holes 4a. In this case, detection optical axis 31a of mounting determination sensor 31 is in a light shielding position in which the slit is not present in dog plate 32, a light transmission signal is not output, and it is determined that the component mounting is failed.

In FIG. 10(c), in a state where component holder 41 does not hold electronic component 9 to be mounted, a state where pusher 30 is lowered is illustrated. In this case, since electronic component 9 to be pressed is not present, pusher 30 is lowered below a normal abutting position. As a result, dog plate 32 is lowered to a position in which first slit 32a is overrun below with respect to detection optical axis 31a of mounting determination sensor 31. Also in this case, detection optical axis 31a of mounting determination sensor 31 is in the light shielding position in which the slit is not present in dog plate 32, the light transmission signal is not output, and it is determined that the component mounting is failed.

A mis-mounting detecting process of electronic component 9 described above is executed by mis-mounting detector 72 (see FIG. 11) included in electronic component mounting apparatus 1. That is, mis-mounting detector 72 detects the position of pusher 30 when the pusher driving device pushes electronic component 9 held by component holder 41 in pusher 30 toward substrate 4, and thereby the mis-mounting of electronic component 9 is detected. Here, the detection of the position of pusher 30 is performed by dog plate 32. First slit 32a and second slit 32b are formed in predetermined positions in dog plate 32. Dog plate 32 is lifted and lowered together with pusher 30 disposed in elevation connector 29 and it is detected whether detection optical axis 31a of mounting determination sensor 31 is in a light shielding state or a light transmitting state by dog plate 32.

Figure 11:
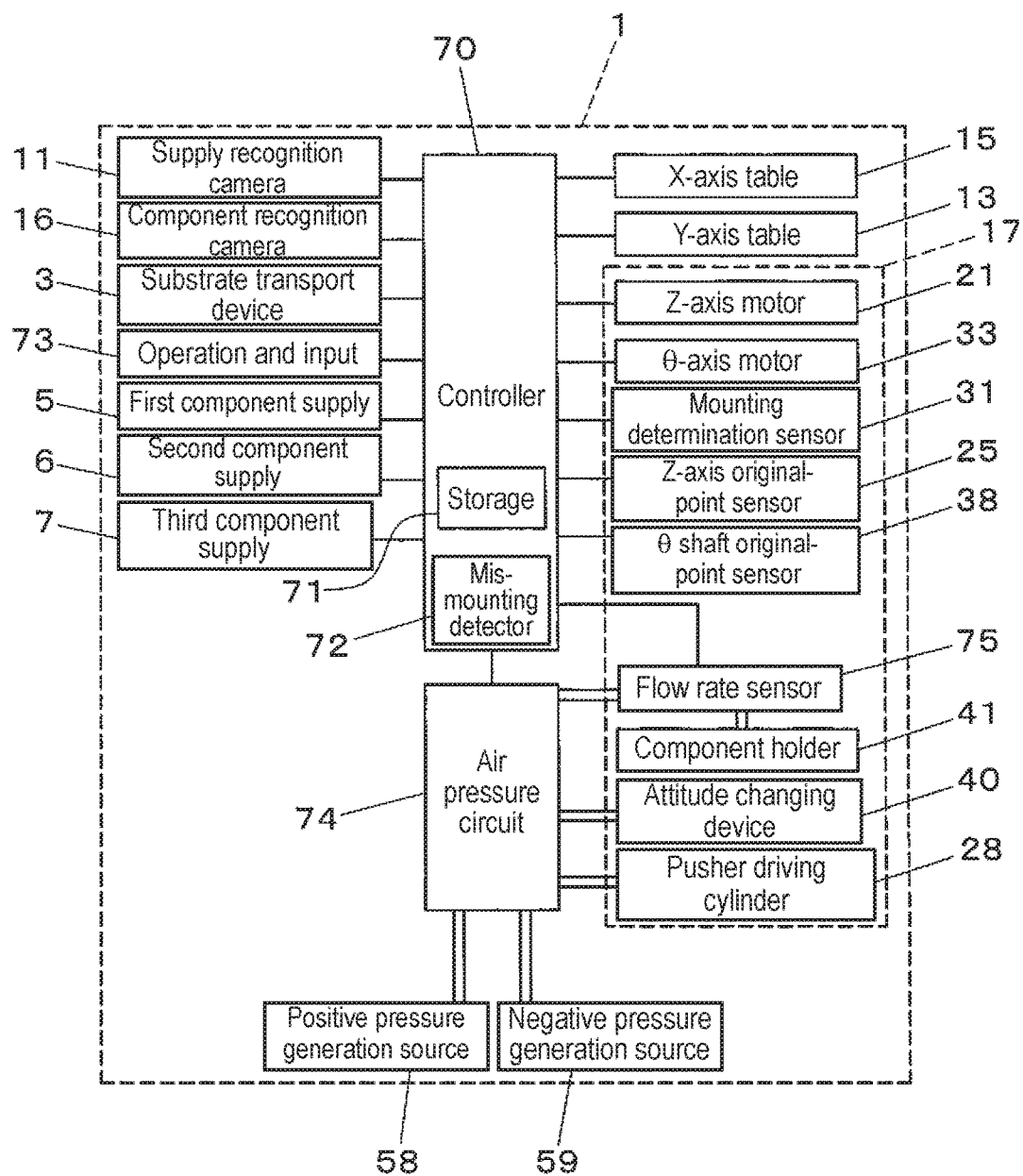
FIG. 11 is a block diagram illustrating a configuration of a control system of the electronic component mounting apparatus of an exemplary embodiment of the disclosure.
Figure 13:
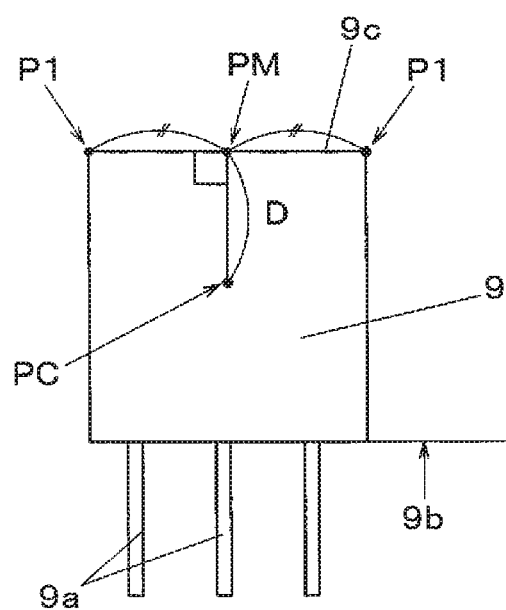
FIG. 13 is a view describing component data stored in a storage of the electronic component mounting apparatus of an exemplary embodiment of the disclosure.

Next, a configuration of a control system will be described with reference to FIG. 11. In FIG. 11, electronic component mounting apparatus 1 has controller 70 in which storage 71 and mis-mounting detector 72 are built. Operation and input 73 is connected to controller 70. An input of an operation command for operating electronic component mounting apparatus 1 and a data input into storage 71 are performed by operation and input 73. An operation program necessary for the component mounting operation by electronic component mounting apparatus 1, component information regarding the electronic component that is the mounting target, and the like are stored in storage 71. Here, as illustrated in FIG. 13, information regarding suction target position PC in the side surface of electronic component 9 is included in the component information stored in storage 71.

In the component information, suction target position PC when sucking the side surface of electronic component 9 by nozzle 42 by positioning mounting head 17 to the electronic component is defined. In an example illustrated in FIG. 13, as a feature point of electronic component 9, two end points P1 of upper surface 9c that is a surface opposite to lower surface 9b in which leads 9a are provided in electronic component 9 are defined. A point that is separated by a predetermined distance D to be set appropriately depending on a component type from a center point PM of the two end points P1 toward a center portion of electronic component 9 is set as suction target position PC. When taking out electronic component 9 in the fallen-down attitude stored in tray 8 of first component supply 5 by mounting head 17, mounting head 17 is positioned so as to suck suction target position PC described above by nozzle 42.

Controller 70 is connected to substrate transport device 3, first component supply 5, second component supply 6, third component supply 7, X-axis table 15, and Y-axis table 13. Controller 70 is connected to Z-axis motor 21 and θ-axis motor 33 which configure mounting head 17, and air pressure circuit 74. Air pressure circuit 74 is valve unit 57, first annular flow path 20c, second annular flow path 20d, first annular flow path 20c, second annular flow path 20d, first connector 50, second connector 51, and the like illustrated in FIG. 4. Air pressure circuit 74 is a fluid circuit for applying a positive pressure or performing vacuum suction for operating each portion of mounting head 17, and is connected to positive pressure generation source 58 and negative pressure generation source 59.

Controller 70 controls air pressure circuit 74 and thereby a positive pressure or a negative pressure is supplied to component holder 41, attitude changing device 40, and pusher driving cylinder 28 at a necessary timing. Therefore, the component suction by nozzle 42 of component holder 41, the attitude change of component holder 41 by attitude changing device 40, and the push-down operation of pusher 30 by pusher driving cylinder 28 are executed. Flow rate sensor 75 is interposed in a flow path leading to component holder 41 and a flow rate measurement result by flow rate sensor 75 is transmitted to mis-mounting detector 72 of controller 70.

In the component mounting operation described above, controller 70 controls each portion described above based on various programs or data stored in storage 71. Therefore, a substrate transporting operation for transporting substrate 4 in electronic component mounting apparatus 1 and the component mounting operation for mounting the electronic component on substrate 4 by taking out the electronic component by mounting head 17 from first component supply 5, second component supply 6, and third component supply 7 are executed. In these operation controls, a detection result transmitted from mounting determination sensor 31, Z-axis original-point sensor 25, and θ shaft original-point sensor 38 provided in mounting head 17 to controller 70 is referred.

An imaging result by supply recognition camera 11 and component recognition camera 16 is recognized-processed by an image recognizing function built in controller 70. The plurality of electronic components 9 stored in tray 8 in the fallen-down attitude in a random state are recognized by the imaging result that is recognized-processed by supply recognition camera 11. Therefore, the direction of each electronic component 9 within the horizontal plane and suction target position PC (see FIG. 13) to be sucked by nozzle 42 are acquired. The imaging result by component recognition camera 16 is recognized-processed and thereby electronic component 9 of a state of being held by mounting head 17 and the positions of the leads of electronic component 10 are acquired.

Next, a function of mis-mounting detector 72 will be described. In electronic component mounting apparatus 1 indicated in the exemplary embodiment, it is possible to selectively use two types of the mis-mounting detection methods depending on the type of the electronic component that is the mounting target. That is, a first mis-mounting detector and a second mis-mounting detector are set in mis-mounting detector 72. For electronic component 9 supplied by first component supply 5, the first mis-mounting detector detects presence or absence of the mis-mounting of electronic component 9 by detecting the position of pusher 30 when pushing electronic component 9 held in component holder 41 by pusher 30 toward substrate 4. For electronic component 10 supplied by second component supply 6, the second mis-mounting detector detects mis-mounting of electronic component 10 by detecting presence or absence of electronic component 10 in suction pad 42a that is at the opening end of nozzle 42 after mounting electronic component 10.

Presence or absence of electronic component 10 in suction pad 42a is performed by comparing the flow rate measurement result of flow rate sensor 75 with a threshold that is set in advance. As the flow rate measurement result of flow rate sensor 75, a vacuum suction flow rate in a state of being vacuum-sucked from suction pad 42a in the component sucking operation may be used. Otherwise, any of the positive pressure exhaustion flow rates in a state of being positive pressure exhausted from suction pad 42a in a component disengagement operation may be used.

Electronic component mounting apparatus 1 indicated in the exemplary embodiment is configured as described above and the component mounting operation by electronic component mounting apparatus 1 will be described in below. First, In electronic component mounting apparatus 1 having the configuration described above, an example, in which the component mounting operation is performed in first component supply 5 and second component supply 6 as the component taking-out targets, will be described. That is, in the example indicated in here, mounting head 17 disposed in multiple-head 14 holds electronic component 9 supplied from first component supply 5 or electronic component 10 supplied from second component supply 6 and mounts electronic component 9 or electronic component 10 on substrate 4 in the stand-up attitude.

As described above, mounting head 17 has component holder 41, attitude changing device 40, and pusher 30, and mounting head 17 having the configuration described above is prepared prior to the component mounting operation (mounting head preparing step). Next, first component supply 5 supplying electronic component 9 in the fallen-down attitude and second component supply 6 supplying electronic component 10 in the stand-up attitude are prepared (component supply preparing step). When executing the component mounting operation, controller 70 controls mounting head 17 and thereby the following operation is performed.

That is, in a case where electronic component 9 supplied from first component supply 5 is mounted on substrate 4, electronic component 9 of the fallen-down attitude is held by nozzle 42 in which suction pad 42a positioned at the opening end is oriented downward. Thereafter, suction pad 42a is oriented sideways and thereby electronic component 9 held by suction pad 42a is changed to the stand-up attitude by attitude changing device 40. Electronic component 9 of the stand-up attitude held by suction pad 42a that is oriented sideways is mounted on substrate 4 by being pushed toward substrate 4 by pusher 30 (first electronic component mounting step).

In a case where electronic component 10 supplied from second component supply 6 is mounted on substrate 4, electronic component 10 of the stand-up attitude is held by nozzle 42 in which suction pad 42a positioned at the opening end is oriented downward. Electronic component 10 of the stand-up attitude held by nozzle 42 in which suction pad 42a is oriented downward is mounted on substrate 4 (second electronic component mounting step).

In the electronic component mounting steps described above, in a case where the mis-mounting of electronic component 9 supplied from first component supply 5 is detected in the first electronic component mounting step, the detection is performed by the first mis-mounting detector that is set in mis-mounting detector 72 (first mis-mounting detecting step). That is, presence or absence of the mis-mounting of electronic component 9 is detected by detecting the position of pusher 30 in the first electronic component mounting step. In a case where the mis-mounting of electronic component 10 supplied from second component supply 6 is detected in the second electronic component mounting step, the detection is performed by the second mis-mounting detector that is set in mis-mounting detector 72 (second mis-mounting detecting step). That is, the mis-mounting of electronic component is detected by detecting presence or absence of electronic component 10 in suction pad 42a of nozzle 42 after the second electronic component mounting step.

Figure 12:
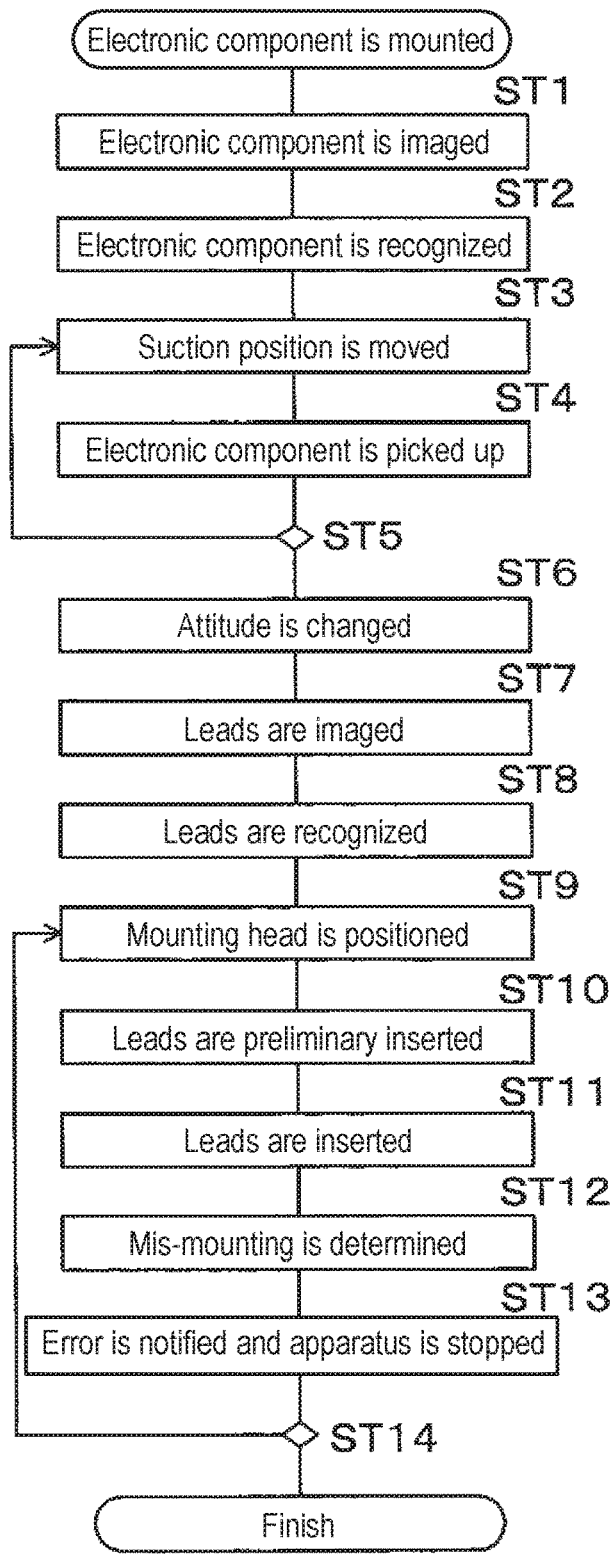
FIG. 12 is a flowchart illustrating an electronic component mounting method of an exemplary embodiment of the disclosure.

Next, the electronic component mounting method by electronic component mounting apparatus 1 indicated in the exemplary embodiment will be described with reference to FIG. 12. Here, the electronic component mounting method, in which in electronic component mounting apparatus 1, electronic component 9 supplied by first component supply 5 is mounted on substrate 4 by inserting leads 9a protruding from the lower surface thereof into insertion holes 4a of substrate 4, will be described.

First, mounting head 17 necessary for executing the mounting operation is prepared prior to start of the electronic component mounting operation (mounting head preparing step). Here, as illustrated in FIGS. 3 and 4, mounting head 17 having component holder 41, attitude changing device 40, pusher 30, and rotator 37 is prepared. In conjunction with this, electronic component 9 is supplied in the fallen-down attitude (electronic component supplying step). That is, in first component supply 5, tray 8 in which electronic components 9 are stored in the fallen-down attitude and in random is prepared. Therefore, it becomes a state where execution of the electronic component mounting operation can be performed.

Figure 14A:
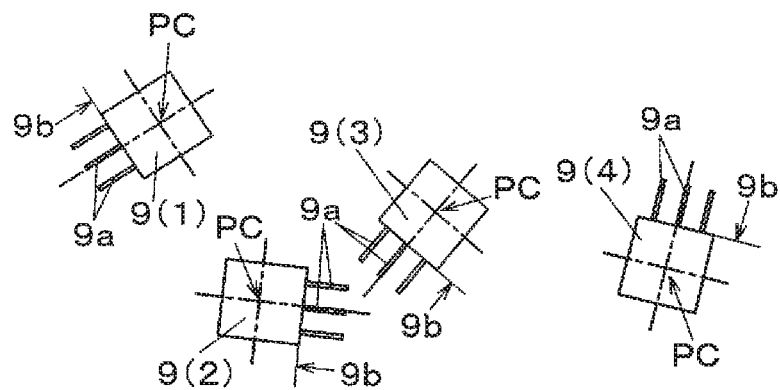
FIG. 14A is a view describing electronic component recognition in the electronic component mounting method of an exemplary embodiment of the disclosure.

If the electronic component mounting operation is started, first, imaging of the electronic component is executed (ST1). That is, electronic component 9 that is the target of the mounting operation among the plurality of electronic components 9 in a random state within tray 8 is imaged from above by supply recognition camera 11. Therefore, an image illustrated in FIG. 14A is acquired. Here, an example, in which four electronic components 9 of electronic components 9(1), (2), (3), and (4) among the plurality of electronic components 9 within tray 8 are imaging objects, is illustrated.

Next, the electronic component recognition is executed for the acquired image (ST2). That is, the position and orientation of electronic component 9 that is supplied in the fallen-down attitude in the horizontal direction is recognized (electronic component recognizing step). In the example illustrated in here, the four electronic components 9 of electronic components 9(1), (2), (3), and (4) which are respectively disposed in different horizontal directions are the targets. Lower surface 9b that is a surface on a side from which leads 9a of electronic component 9 are extended, the orientation (direction angle orthogonal to lower surface 9b) in the horizontal direction, and suction target position PC defined by definition illustrated in FIG. 13 are acquired by the recognizing process.

Next, suction position movement for moving mounting head 17 is performed based on the position recognition result acquired in FIG. 14A (ST3). Here, a mounting operation turn of one time in which multiple-head 14 is moved from first component supply 5 to substrate 4, an example, in which the plurality of mounting heads 17 disposed in multiple-head 14 are sequentially positioned in electronic components 9, is indicated. That is, in each mounting head 17, the plurality of mounting heads 17 of multiple-head 14 are sequentially moved so that suction pad 42a that is at the opening end is positioned above the plurality of electronic components 9 recognized in the electronic component recognizing step. At the same time of the movement, lower surface 9b from which leads 9a protrude in electronic component 9 is oriented in a direction opposite to pusher 30 and rotator 37 is horizontally rotated (electronic component suction preparing step).

In this case, component information (FIG. 13) stored in storage 71 is read prior to the electronic component suction preparing step and information regarding suction target position PC in the side surface of electronic component 9 is referred (component information referring step). In the electronic component suction preparing step, mounting head 17 is moved so that suction pad 42a that is at the opening end of nozzle 42 is correctly positioned above suction target position PC.

Figure 14B:
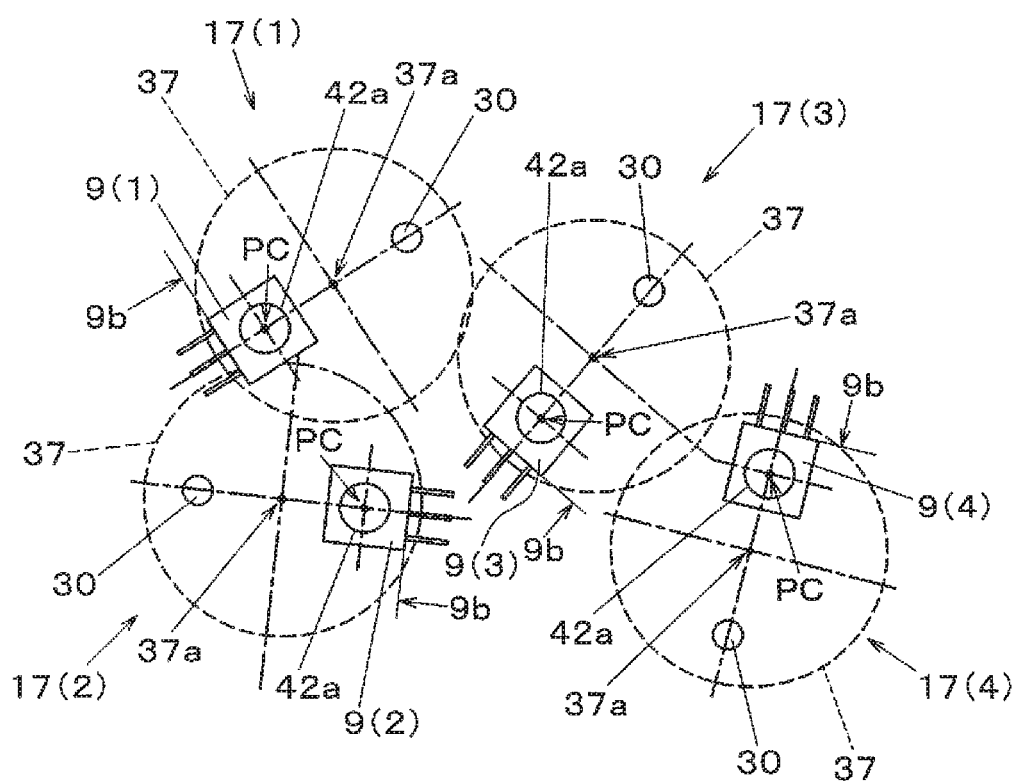
FIG. 14B is a view describing electronic component pick-up in the electronic component mounting method of an exemplary embodiment of the disclosure.

FIG. 14B illustrates a state when mounting heads 17(1), (2), (3), and (4) included in multiple-head 14 are respectively and sequentially positioned in four electronic components 9(1), (2), (3), and (4) illustrated in FIG. 14A. For example, when positioning mounting head 17(1) in electronic component 9(1), suction pad 42a of mounting head 17(1) is positioned in suction target position PC of electronic component 9(1). At the same time, mounting head 17(1) is positioned so that pusher 30 and rotation center 37a are positioned on a straight line perpendicular to lower surface 9b as suction target position PC, and rotation center 37a is interposed between suction target position PC and pusher 30.

Next, electronic component pick-up is executed (ST4). Here, first, electronic component 9(1) is picked up by mounting head 17(1) described above. That is, in mounting head 17(1), component holder 41 is lowered by driving Z-axis motor 21, suction target position PC of electronic component 9(1) of the fallen-down attitude is sucked and held by suction pad 42a of nozzle 42 (electronic component pick-up step). The electronic component pick-up step is repeatedly executed until the pick-up of all electronic components 9 that is scheduled in the component mounting turn is completed (ST5). That is, similarly, electronic components 9(2), (3), and (4) are sequentially picked up by following mounting heads 17(2), (3), and (4).

Next, the attitude change of component holder 41 is executed (ST6). That is, in each mounting head 17 which picks up and holds electronic component 9, component holder 41 is vertically rotated by attitude changing device 40. Therefore, the attitude of electronic component 9 held by being sucked in suction pad 42a is changed to the stand-up attitude in which lower surface 9b from which leads 9a protrude is oriented downward (attitude changing step).

Next, lead imaging is executed. That is, multiple-head 14 is moved above component recognition camera 16 and, in here, leads 9a of electronic component 9 held in each mounting head 17 of multiple-head 14 in the stand-up attitude are imaged by component recognition camera 16 from below (ST7). Next, lead recognition is performed. That is, the positions of leads 9a are recognized in each electronic component 9 by recognizing an image acquired by imaging by the recognition processing function built in controller 70 (lead recognizing step) (ST8).

Thereafter, positioning of mounting head 17 is performed (ST9). That is, multiple-head 14 is moved above substrate 4, the plurality of mounting heads 17 included in multiple-head 14 are sequentially positioned in the component mounting positions of substrate 4, and the component mounting operation is executed. Here, first, leads 9a of electronic component 9 of which the attitude is changed to the stand-up attitude and insertion holes 4a (see FIGS. 8 and 9) of substrate 4 into which leads 9a are inserted are positioned by moving mounting head 17(1) (positioning step). The positioning step is performed based on the positions of leads 9a recognized in the lead recognizing step that is executed after the attitude changing step.

A plurality of leads 9a are included in electronic component 9 and a direction in which the plurality of leads 9a are disposed in parallel is, as illustrated in FIGS. 14A and 14B, different by each electronic component 9 in a state where electronic component 9 is sucked and held by suction pad 42a of component holder 41. In order to correctly mount electronic component 9 on substrate 4 by inserting leads 9a of such a state into insertion holes 4a formed in substrate 4 in a predetermined direction, it is necessary to match a row direction of the plurality of leads 9a to a row direction of insertion holes 4a corresponding thereto. Thus, in positioning step described above, the row direction of leads 9a is matched to the row direction of insertion holes 4a by horizontally rotating rotator 37 around rotation center 37a.

Next, lead preliminary inserting is performed (ST10). Here, only the lower ends of leads 9a of electronic component 9 of the stand-up attitude are inserted into insertion holes 4a of substrate 4 by lowering component holder 41 to substrate 4 between the positioning step in which leads 9a and insertion holes 4a are positioned, and the following inserting step described below (preliminary inserting step). Thereafter, lead inserting is performed (ST11). That is, electronic component 9 is pushed to substrate 4 and leads 9a are completely inserted into insertion holes 4a of substrate 4 by causing pusher 30 to abut against the upper surface of electronic component 9 of the stand-up attitude (inserting step).

Next, mis-mounting determination is performed (ST12). Here, after the inserting step, presence or absence of the mis-mounting of the electronic component mounting is determined by detecting the position of pusher 30 (mis-mounting determining step). The determination of the mis-mounting is performed by the method illustrated in FIG. 10. Here, in a case where it is determined that the mis-mounting is present (see the mounting failure example illustrated in FIGS. 10(b) and 10(c)), an error is notified and the apparatus is stopped (ST13). That is, the fact of the mis-mounting is notified by a notification unit (not illustrated) such as a notification lamp, a notification screen, and the like included in electronic component mounting apparatus 1, and then the apparatus is stopped.

In a case where it is determined that the mis-mounting is absent in (ST12) and after a predetermined treatment is executed in (ST13), and then the apparatus operation is restarted, the operating process of (ST9) or later is repeatedly executed (ST14) for the next mounting head 17 included in multiple-head 14. Completion of all operations is confirmed for mounting head 17 of the mounting operation target in multiple-head 14 in (ST14), and then the electronic component mounting operation is completed.

As described above, in electronic component mounting apparatus 1 indicated in the exemplary embodiment, attitude changing device 40 is provided in mounting head 17 in which electronic component 9 is mounted on substrate 4 by changing the attitude of electronic component 9 having the leads. Attitude changing device 40 changes the attitude of component holder 41 having nozzle 42 for holding electronic component 9 by using the negative pressure so that suction pad 42a of nozzle 42 is oriented downward or sideways. Leads 9a are inserted by pushing electronic component 9 of the fallen-down attitude held by nozzle 42 toward substrate 4 by pusher 30 and attitude changing device 40 is mounted on rotator 37 that is horizontally rotatable with respect to the elevator that is lifted and lowered by the elevation device. Therefore, it is possible to mount electronic component 9 on substrate 4 by changing the attitude of electronic component 9 by mounting head 17 having a compact configuration.

In electronic component mounting apparatus 1 and the electronic component mounting method indicated in the exemplary embodiment, in the electronic component mounting in which electronic component 9 supplied by first component supply 5 in the fallen-down attitude and electronic component 10 of the stand-up attitude supplied by second component supply 6 are mounted on substrate 4 by common mounting head 17, mounting head 17 is operated as described below. In a case where electronic component 9 supplied in the fallen-down attitude is mounted, electronic component 9 of the fallen-down attitude is held by nozzle 42 that is oriented downward. After being held, electronic component 9, of which the attitude is changed to the stand-up attitude by causing nozzle 42 to be oriented sideways by attitude changing device 40, is mounted on substrate 4 by being pushed toward substrate 4 by the pusher. In a case where electronic component 10 supplied in the stand-up attitude is mounted, electronic component 10 of the stand-up attitude is mounted on substrate 4 while holding electronic component 10 of the stand-up attitude by nozzle 42 that is oriented downward. Thus, a plurality of electronic components 9 and 10 supplied in different attitudes are taken out and it is possible to efficiently mount electronic components 9 and 10 on substrate 4 by changing the attitudes of the electronic components as needed.

In the electronic component mounting method for mounting electronic component 9 having leads 9a protruding from the lower surface on substrate 4 by electronic component mounting apparatus 1 indicated in the exemplary embodiment, the position and orientation of electronic component 9 supplied in the fallen-down attitude in the horizontal direction are recognized. Mounting head 17 is moved so that nozzle 42 of mounting head 17 is positioned above electronic component 9. Rotator 37 is horizontally rotated so that the lower surface of electronic component 9 is oriented in the direction opposite to the pusher. Electronic component 9 of the fallen-down attitude is sucked and held by nozzle 42 by lowering component holder 41, and the attitude of electronic component 9, which is held by vertically rotating component holder 41, is changed to the stand-up attitude. Leads 9a of electronic component 9 of which the attitude is changed to the stand-up attitude and insertion holes 4a of substrate 4 into which leads 9a are inserted are positioned. Leads 9a are inserted into insertion holes 4a of substrate 4 by causing pusher 30 to abut against the upper surface of electronic component 9 of the stand-up attitude and push the electronic component onto substrate 4. Therefore, it is possible to efficiently mount electronic component 9 on substrate 4 by changing the attitude of electronic component 9 by mounting head 17 having a compact configuration for electronic component 9 having protruded leads 9a supplied in the fallen-down attitude.

The electronic component mounting method of the disclosure has an effect, in which it is possible to efficiently mount the electronic component on the substrate by changing the attitude of the electronic component by the mounting head having a compact configuration for the electronic component having the protruded leads supplied in the fallen-down attitude. It is useful in a field in which the electronic component is mounted on the substrate by the mounting head.

What is claimed is:

1. An electronic component mounting method for mounting an electronic component on a substrate by inserting at least one lead protruding from a lower surface of the electronic component into an insertion hole of the substrate, the method comprising:
   a mounting head provision step of providing a mounting head including a component holder having a nozzle in which a suction path opened downward is formed and the nozzle for holding the electronic component at an opening end of the suction path by using negative pressure, a pusher for abutting against the electronic component held by the nozzle and pushing the electronic component onto the substrate, and a rotator on which the component holder and the pusher are mounted, and the rotator being horizontally rotatable about a vertical axis;
   an electronic component supply step of supplying the electronic component in a fallen-down attitude;
   an electronic component recognition step of recognizing a position and an orientation, in a horizontal direction, of the electronic component supplied in the fallen-down attitude;
   an electronic component suction preparation step of horizontally rotating the rotator about the vertical axis so that the lower surface of the electronic component is oriented in a direction opposite to the pusher and moving the mounting head so as to position the opening end above the electronic component recognized in the electronic component recognition step;
an electronic component pick-up step of sucking and holding the electronic component in the fallen-down attitude at the opening end of the nozzle by lowering the component holder;
an attitude change step of changing an attitude of the electronic component held at the opening end to a stand-up attitude by vertically rotating the component holder in a vertical plane;
a positioning step of positioning the at least one lead of the electronic component of which the attitude is changed to the stand-up attitude relative to the insertion hole of the substrate into which the at least one lead is to be inserted by moving the mounting head; and
an insertion step of inserting the at least one lead into the insertion hole of the substrate by causing the pusher to abut against an upper surface of the electronic component in the stand-up attitude and pushing the electronic component toward the substrate.

2. The method of claim 1, further comprising:
a preliminary insertion step of inserting a lower end of the at least one lead of the electronic component in the stand-up attitude into the insertion hole of the substrate by lowering the component holder to the substrate between the positioning step and the insertion step.

3. The method of claim 1, further comprising:
a lead recognition step of recognizing the position of the at least one lead of the electronic component after the attitude change step,
wherein the positioning step is performed based on the position of the at least one lead recognized in the lead recognition step.

4. The method of claim 1, further comprising:
a component information reference step of referring to stored information regarding a suction target position on a side surface of the electronic component,
wherein the mounting head is moved so that the opening end is positioned above the suction target position in the electronic component suction preparation step.

5. The method of claim 1, further comprising:
a mis-mounting determination step of determining presence or absence of mis-mounting of the electronic component by detecting a position of the pusher after the insertion step.

6. An electronic component mounting apparatus comprising:
a mounting head for mounting an electronic component on a substrate,
wherein the mounting head includes
an elevation device;
an elevator that is liftable and lowerable by the elevation device;
a rotator that is horizontally rotatable about a vertical axis with respect to the elevator;
a rotation device for causing the rotator to horizontally rotate about the vertical axis with respect to the elevator;
a component holder that has a suction path connected to a negative pressure generating source and a nozzle for holding the electronic component at an opening end of the suction path by using negative pressure generated by the negative pressure generating source;
an attitude changing device that is mounted on the rotator, the attitude changing device for changing an attitude of the component holder so that an opening end of the nozzle is oriented downward or sideways;
a pusher for abutting against the electronic component held in the nozzle that is oriented sideways; and
a pusher driving device for pushing the electronic component held in the nozzle toward the substrate by driving the pusher.

7. The apparatus of claim 6,
wherein the attitude changing device is mounted on a lower portion of the rotator and the component holder is mounted on a lower portion of the attitude changing device.

8. The apparatus of claim 7,
wherein the attitude changing device includes a rotatable swing member disposed about a horizontal shaft and a piston for rotating the swing member by moving upward and downward by air pressure, and
wherein the component holder is mounted on an output shaft that is the horizontal shaft such that the component holder is rotatable together with the swing member.

9. The apparatus of claim 7,
wherein the pusher is horizontally rotatable about the vertical axis together with the rotator.

10. The apparatus of claim 9,
wherein an abutting portion abutting against the electronic component in the pusher is disposable in a position horizontally separated from a rotation center of the rotator, and
wherein a center of the opening end of the nozzle facing downward is disposed in a position in which the rotation center of the rotator is sandwiched between the center of the opening end and the pusher in a plan view.

11. The apparatus of claim 10,
wherein the pusher is disposed so as to vertically pass through the rotator, the abutting portion is provided in a lower end portion of the pusher protruding downward the rotator, and an upper end portion of the pusher is coupled to the pusher driving device.

12. The apparatus of claim 11,
wherein the pusher driving device includes a sub-elevator that is vertically movable by a driving source and a coupler that is mounted below the sub-elevator to be horizontally rotatable about the vertical axis and coupled to an upper end portion of the pusher.

13. The apparatus of claim 6,
wherein the pusher driving device includes a mis-mounting detector for detecting mis-mounting of the electronic component by detecting a position of the pusher when the pusher driving device pushes the electronic component held in the component holder toward the substrate by the pusher.

* * * * *